United States Patent [19]

Choi

[11] Patent Number: 5,688,661

[45] Date of Patent: Nov. 18, 1997

[54] FABRICATION METHOD FOR MASK ROM

[75] Inventor: Jae Seung Choi, Seoul, Rep. of Korea

[73] Assignee: LG Semicon Co., Ltd., Cheongju, Rep. of Korea

[21] Appl. No.: 773,843

[22] Filed: Dec. 27, 1996

[30] Foreign Application Priority Data

Dec. 30, 1995 [KR] Rep. of Korea ............... 68655/1995

[51] Int. Cl.$^6$ .............................. H01L 21/8246
[52] U.S. Cl. ........................ 437/48; 437/45; 437/52
[58] Field of Search .......................... 437/45, 48, 52

[56] References Cited

U.S. PATENT DOCUMENTS

| | | | |
|---|---|---|---|
| 5,362,662 | 11/1994 | Yuichi | 437/52 |
| 5,523,251 | 6/1996 | Hong | 437/48 |
| 5,589,414 | 12/1996 | Wann et al. | 437/48 |
| 5,610,092 | 3/1997 | Tasaka | 437/48 |

*Primary Examiner*—Jey Tsai
*Attorney, Agent, or Firm*—Fleshner & Kim

[57] ABSTRACT

A fabrication method for a mask ROM which is capable of embodying a high speed of the mask rom by reducing a resistance of a diffusion buried layer of a semiconductor memory device having a flat structure, includes the steps of forming a diffusion buried layer on a semiconductor substrate, forming a silicide layer on the diffusion buried layer and forming a first insulating layer on the silicide layer, forming a pattern including the first insulating layer, the silicide layer and the diffusion buried layer by forming and patterning a photoresist layer on the first insulating layer, forming sidewall spacers at both sides of the pattern, forming and patterning a polysilicon layer on the entire resultant surface of the semiconductor substrate, and performing a data coding on a predetermined portion of the semiconductor substrate.

8 Claims, 4 Drawing Sheets

FABRICATION METHOD FOR MASK ROM

BACKGROUND OF THE INVENTION

1. Field of the Invention

The present invention relates to a fabrication method, and more particularly, to an improved fabrication method for a mask ROM which is capable of achieving a high speed by reducing a resistance of a diffusion buried layer of a semiconductor memory device having a flat structure.

2. Description of the Prior Art

In a flat NOR type mask ROM according to the conventional art, a diffusion buried layer ($BN^+$) is used as source/drain of a bit line and a cell transistor, and generally, a key factor that limits the characteristic and speed of the conventional mask ROM is a resistance value of the diffusion buried layer ($BN^+$).

A fabrication method for a mask ROM according to the conventional art will now be described in detail with reference to FIGS. 1A through 1D.

A well is formed on a semiconductor substrate 1 through an ion implantation, and an isolation region is formed on a predetermined region on the substrate 1 to perform a process of defining a cell area and a peripheral area. Then, an ion implantation for adjusting a threshold voltage (Vth) is carried out. Then, as shown in FIG. 1A, a photoresist layer 2 is formed on the substrate 1 to define and pattern a diffusion buried layer ($BN^+$) region.

As shown in FIG. 1B, using the patterned photoresist layer 2 as a mask, an ion implantation (Pb or As) for forming a diffusion buried layer is carried out and thermally treated. Then, the photoresist layer 2 is stripped. As a result, on the substrate 1, a diffusion buried layer, that is, an impurity region ($N^+$) is formed.

As shown in FIG. 1C, a gate insulating layer 3 is formed on the substrate 1.

As shown in FIG. 1D, a polysilicon layer 4 is formed on the gate insulating layer 3, and patterned to form a word line by performing a photolithography process. Here, on the substrate 1, a predetermined portion of the impurity region ($N^+$) is exposed to serve as source/drain regions of the transistor. Then, a data coding process is performed on the exposed source/drain regions (not illustrated). Then, an insulating film is deposited on the substrate 1, a contact hole is formed, and a mask ROM is completed by performing general processes such as a metal interconnection.

However, according to the conventional fabrication method for a mask ROM having the above construction, since the resistance of the impurity region ($N^+$) is hundreds of times larger than that of a metal, when the impurity region ($N^+$) is used as a bit line, a large sheet resistance and contact resistance cause much difficulty in fabricating a semiconductor memory device which requires a high speed.

SUMMARY OF THE INVENTION

Accordingly, it is an object of the present invention to provide an improved fabrication method for a mask ROM according to the present invention which is capable of embodying a high speed by reducing a resistance of a diffusion buried layer of a semiconductor memory device having a flat structure.

To achieve the above object, there is provided an improved fabrication method for a mask ROM according to the present invention which includes the steps of forming a diffusion buried layer on a semiconductor substrate, forming a silicide layer on the diffusion buried layer and forming a first insulating layer on the silicide layer, forming a pattern including the first insulating layer, the silicide layer and the diffusion buried layer by forming and patterning a photoresist layer on the first insulating layer, forming a sidewall spacer at both sides of the pattern, forming and patterning a polysilicon layer on the entire resultant surface of the semiconductor substrate, and performing a data coding on a predetermined portion of the semiconductor substrate.

BRIEF DESCRIPTION OF THE DRAWINGS

The present invention will become more fully understood from the detailed description given hereinbelow and the accompanying drawings which are given by way of illustration only, and thus are not limitative of the present invention, wherein.

DETAILED DESCRIPTION OF THE PREFERRED EMBODIMENTS

A fabrication method for a mask ROM according to the present invention will now be described in detail with reference to the accompanying drawings.

First, the process of forming a well by performing an ion implantation in a semiconductor substrate 11, and of forming an isolation region on a predetermined portion of the substrate to define a cell area and a peripheral area are identical to those of the conventional art. The succeeding process will now be described with reference to FIGS. 2A through 2I.

Figure 1A:
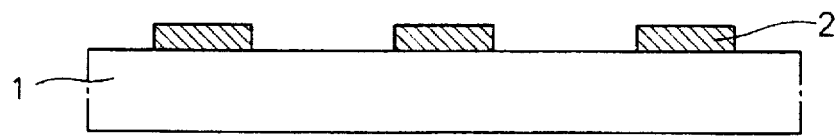
FIGS. 1A through 1D are cross-sectional views showing a fabrication method for a mask ROM according to the conventional art.
Figure 1B:
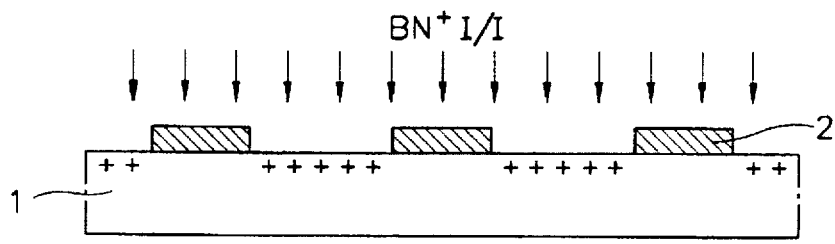
Figure 1C:
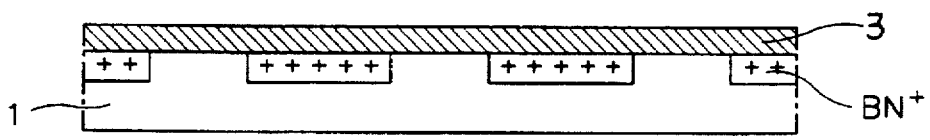
Figure 1D:
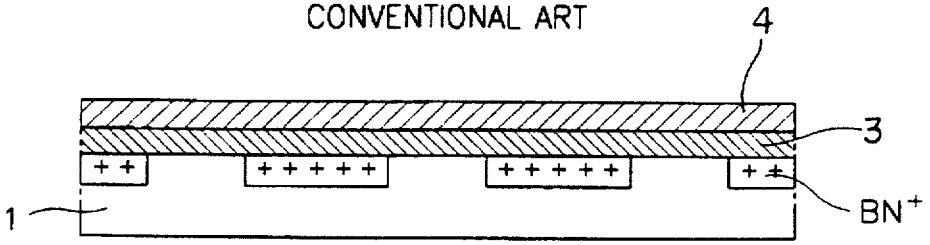
Figure 2A:
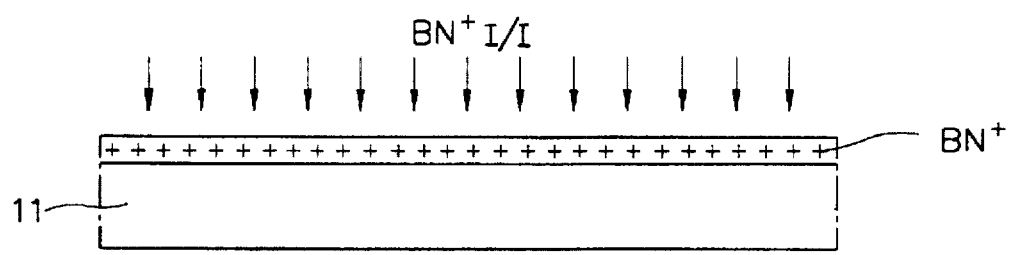
FIGS. 2A through 2I are cross-sectional views taken along the line A—A in FIG. 3 according to the present invention.

As shown in FIG. 2A, a diffusion buried layer ($BN^+$) is formed by performing an ion implantation (Pb or As) on the entire surface of the substrate 11.

Figure 2B:
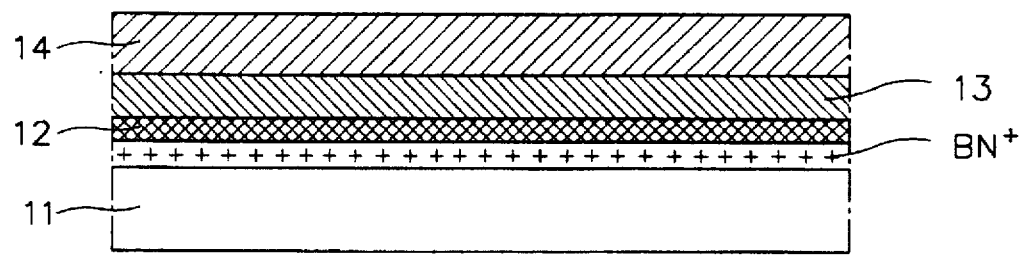

As shown in FIG. 2B, a silicide layer 12 composed of a refractory metal is formed on the substrate 11, and then a first insulating layer 13 is formed on the silicide layer 12, and then a photoresist layer 14 is coated on the first insulating layer 13.

Figure 2C:
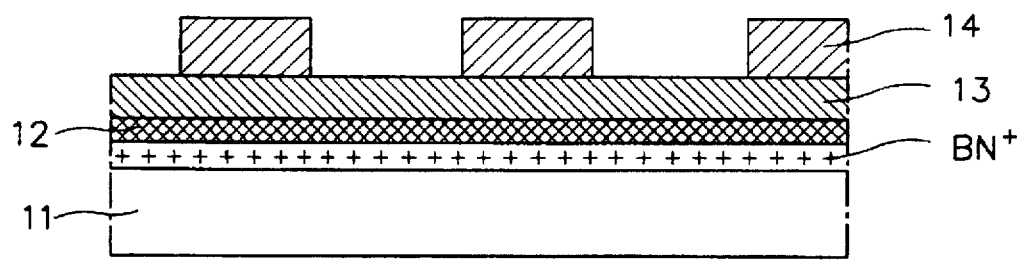

As shown in FIG. 2C, a predetermined portion of the photoresist layer 14 is defined and patterned.

Figure 2D:
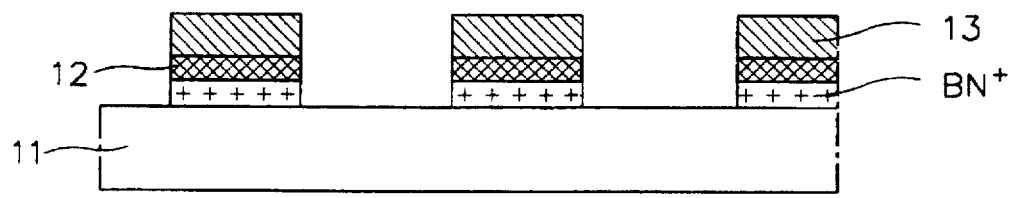

As shown in FIG. 2D, using the patterned photoresist layer 14 as a mask, the first insulating layer 13, the silicide layer 12, and the substrate 11 are etched to be stripped. Finally, a recess region is formed on the substrate 11.

Figure 2E:
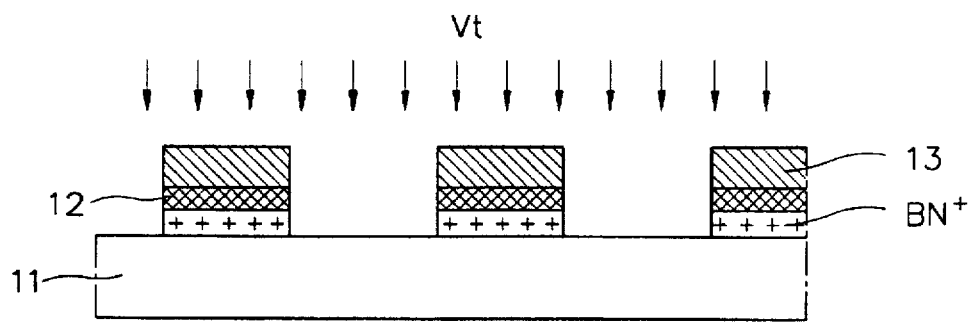

As shown in FIG. 2E, an ion implantation for adjusting a threshold voltage (Vth) is performed using the pattern formed on the substrate 11.

Figure 2F:
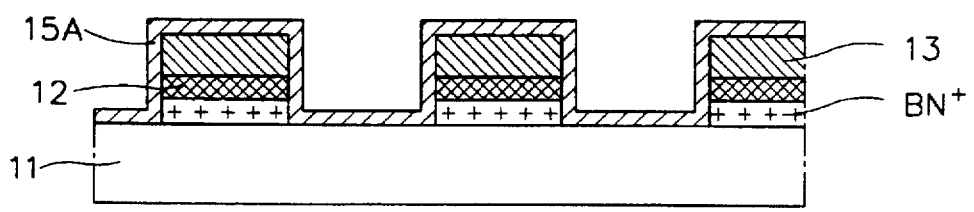

As shown in FIG. 2F, a second insulating layer 15 is formed on the entire resultant surface of the substrate 11.

Figure 2G:
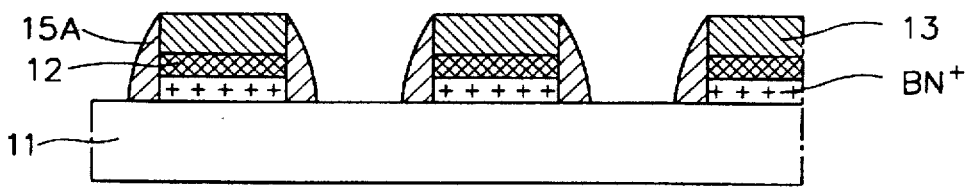

As shown in FIG. 2G, a predetermined portion of the second insulating layer 15 is stripped by etching, thereby forming sidewall spacers 15a at both sides of the pattern.

Figure 2H:
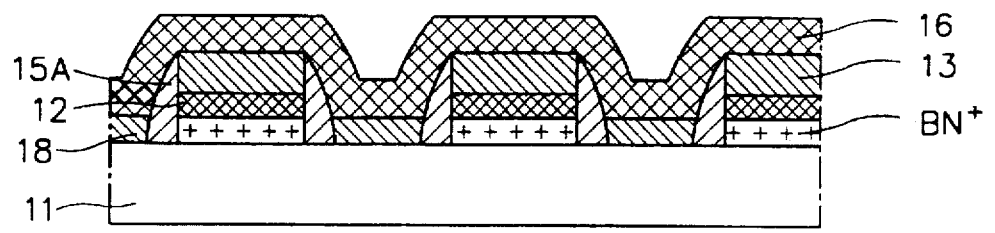

As shown in FIG. 2H, a gate insulating layer 18 is formed at source/drain regions on the substrate 11, and a polysilicon to serve as a conductive layer is deposited on the entire resultant surface of the substrate 11 to form a polysilicon layer 16. The polysilicon layer 16 is defined and patterned by a photolithography process, resulting in forming source/drain regions on the substrate 11.

Figure 2I:
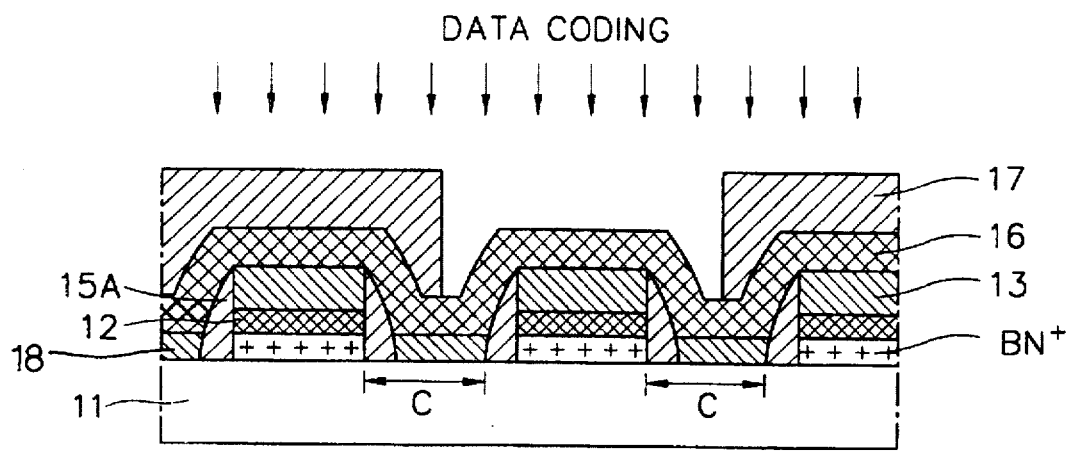

As shown in FIG. 2I, a photoresist layer 17 is formed on the substrate 11 having the polysilicon layer 16 thereon and patterned. Then, a data coding process is carried out on a predetermined portion of the patterned polysilicon layer 16.

Figure 3:
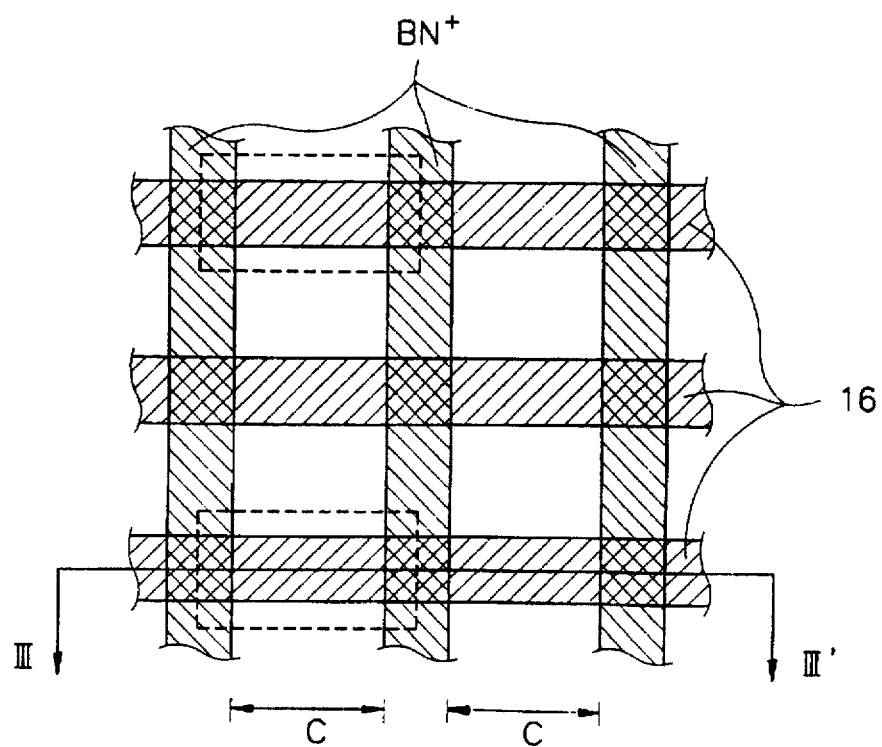
FIG. 3 is a plan view showing a data coding region in a fabrication method for a mask ROM according to the present invention.

That is, as shown in FIG. 3, a high voltage (5V) is applied on the region (a dotted region) which is opened by the mask, so that data is coded and a low voltage (0.7V) is applied on the region covered by the mask so that the data coding is not performed.

The diffusion buried layer ($N^+$) serves as the source/drain regions of the transistor, and reference numeral C represents a channel.

Then, to carry out a general metal interconnection, an insulating layer (not illustrated) is deposited, a contact hole is formed, and then the metal interconnection is performed, then a passivation is carried out, thereby completing a fabrication for a mask ROM.

As shown in this drawing, the fabrication method for a mask ROM according to the present invention is characterized in that a silicide layer composed of a refractory metal is formed on a semiconductor substrate, and the silicide layer formed on the diffusion buried layer ($BN^+$) effectively reduces a sheet resistance of a bit line and a contact resistance of source/drain regions. As a result, resistances (the sheet resistance and the contact resistance) can be reduced in comparison with the case when the diffusion buried layer is used as a bit line, resulting in embodying a high speed.

A cell-transistor used in the present invention has the structure that a channel-formed region in the semiconductor substrate is recessed by etching so that a shallow junction is made between the source/drain regions. As a result, a punch through and a drain-induced barrier lowering (DIBL) can be improved.

Further, the cell according to the present invention does not require a separate photo work and alignment but an effective self-aligned structure in forming a silicide.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A fabrication method for a mask ROM according to present invention, comprising the steps of:

forming a diffusion buried layer on a semiconductor substrate;

forming a silicide layer on the diffusion buried layer and forming a first insulating layer on the silicide layer;

forming a pattern comprising the first insulating layer, the silicide layer and the diffusion buried layer by forming and patterning a photoresist layer on the first insulating layer;

forming sidewall spacers at both sides of the pattern;

forming and patterning a polysilicon layer on the entire resultant surface of the semiconductor substrate; and performing a data coding on a predetermined portion of the semiconductor substrate.

2. The method of claim 1, wherein after the data decoding, the method further comprises the steps of:

forming an insulating layer;

forming a contact hole on the substrate;

forming a metal layer on the insulating layer having the contact hole thereon; and carrying out a passivation on the metal layer.

3. The method of claim 1, wherein the insulating layer is composed of an oxide film ($SiO_2$).

4. The method of claim 1, wherein an ion implantation for adjusting a threshold voltage is performed after the pattern is formed.

5. The method of claim 1, wherein after the polysilicon layer is patterned, a photoresist layer is formed on the polysilicon layer, and the photoresist layer is patterned to perform the data coding process.

6. The method of claim 1, wherein after the photoresist layer is formed and patterned on the first insulating layer, the first insulating layer, the silicide layer and the exposed substrate are etched using the patterned photoresist layer as a mask.

7. The method of claim 6, wherein a predetermined size of a recess region is formed by the etching of the substrate.

8. The method of claim 6, wherein a shallow junction between the source/drain regions is performed by the recess region.

* * * * *